US010276600B2

United States Patent
I et al.

(10) Patent No.: US 10,276,600 B2
(45) Date of Patent: Apr. 30, 2019

(54) PIXEL STRUCTURE AND RELATED FABRICATION METHOD

(71) Applicant: AU Optronics Corporation, Hsin-Chu (TW)

(72) Inventors: Chu-Hsuan I, Hsin-Chu (TW); Yi-Wei Chen, Hsin-Chu (TW)

(73) Assignee: AU OPTRONICS CORPORATION, Hsin-Chu (TW)

( * ) Notice: Subject to any disclaimer, the term of this patent is extended or adjusted under 35 U.S.C. 154(b) by 0 days.

(21) Appl. No.: 15/626,306

(22) Filed: Jun. 19, 2017

(65) Prior Publication Data

US 2018/0076224 A1 Mar. 15, 2018

(30) Foreign Application Priority Data

Sep. 9, 2016 (TW) ............................. 105129198 A (51) Int. Cl.
 *H01L 27/12* (2006.01)
(52) U.S. Cl.
 CPC ................... *H01L 27/124* (2013.01)
(58) Field of Classification Search
 CPC ........................ H01L 27/124; H01L 27/1244
 USPC ................................................. 257/773–775
 See application file for complete search history.

(56) References Cited

U.S. PATENT DOCUMENTS

| 5,107,355 | A * | 4/1992 | Satoh | G02F 1/1362 345/205 |
| 6,420,758 | B1 * | 7/2002 | Nakajima | H01L 29/4908 257/350 |
| 8,742,811 | B2 * | 6/2014 | Umezaki | G02F 1/13624 327/199 |
| 9,640,561 | B2 * | 5/2017 | Park | H01L 27/124 |
| 9,690,153 | B2 * | 6/2017 | Iki | G02F 1/136213 |
| 9,691,833 | B2 * | 6/2017 | Oh | H01L 27/3262 |
| 9,716,180 | B2 * | 7/2017 | Higaki | H01L 29/78669 |
| 10,109,704 | B2 * | 10/2018 | Shin | H01L 51/56 |
| 10,139,686 | B2 * | 11/2018 | Zou | G02F 1/136286 |
| 2001/0052952 | A1 * | 12/2001 | Choo | G02F 1/133555 349/43 |

(Continued)

FOREIGN PATENT DOCUMENTS

CN 104659106 A 5/2015

OTHER PUBLICATIONS

Machine translation, Huang, Chinese Pat. Pub. No. CN 104659106, translation date: May 12, 2018; Espacenet, all pages.*

*Primary Examiner* — Victoria K. Hall
(74) *Attorney, Agent, or Firm* — WPAT, PC (57) ABSTRACT

A pixel structure includes a first insulating layer, a second metal layer, a second insulating layer, and a third metal layer. The second metal layer is disposed on the first insulating layer, and the second metal layer includes at least one first data line, at least one source, and at least one first drain, wherein the first data line is electrically connected to the source. The second insulating layer is disposed on the second metal layer, the second insulating layer includes at least one opening that is disposed corresponding to the first drain, and the area of the opening is greater than the area of the first drain. The third metal layer includes at least one second drain that is electrically connected to the first drain, the second drain is disposed corresponding to the opening and disposed on the first drain.

13 Claims, 12 Drawing Sheets

(56) References Cited

U.S. PATENT DOCUMENTS

| | | | |
|---|---|---|---|
| 2002/0067322 A1* | 6/2002 | Yanagawa | G02F 1/134363 345/87 |
| 2003/0010922 A1* | 1/2003 | Yoon | H01L 27/1214 250/370.09 |
| 2006/0006540 A1* | 1/2006 | Park | H01L 27/3248 257/758 |
| 2007/0236640 A1* | 10/2007 | Kimura | G02F 1/134363 349/141 |
| 2008/0136989 A1* | 6/2008 | Higaki | H01L 27/12 349/46 |
| 2008/0149937 A1* | 6/2008 | Moriwaki | G02F 1/136227 257/72 |
| 2010/0055894 A1* | 3/2010 | Hanaoka | H01L 21/76823 438/597 |
| 2010/0171131 A1* | 7/2010 | Iki | H01L 29/78633 257/91 |
| 2011/0084337 A1* | 4/2011 | Yamazaki | H01L 27/124 257/347 |
| 2012/0113376 A1* | 5/2012 | Hayashi | H01L 27/124 349/141 |
| 2012/0249944 A1* | 10/2012 | Yoshii | H01L 27/0296 349/152 |
| 2013/0113109 A1* | 5/2013 | Nagano | G02F 1/1345 257/773 |
| 2013/0140570 A1* | 6/2013 | Kang | G02F 1/134363 257/59 |
| 2014/0292622 A1* | 10/2014 | Lee | G09G 3/3233 345/80 |
| 2014/0340607 A1* | 11/2014 | Nakata | H01L 29/7869 349/46 |
| 2014/0346460 A1* | 11/2014 | Kang | H01L 27/3279 257/40 |
| 2014/0346504 A1* | 11/2014 | Misaki | H01L 21/0217 257/43 |
| 2014/0347590 A1* | 11/2014 | Fujita | G02F 1/1368 349/43 |
| 2015/0187959 A1* | 7/2015 | Yoon | H01L 27/1225 257/43 |
| 2015/0194443 A1* | 7/2015 | Chen | H01L 27/1248 257/72 |
| 2015/0200207 A1* | 7/2015 | Nozu | G02F 1/133502 257/71 |
| 2015/0311227 A1* | 10/2015 | Moriwaki | G02F 1/134363 257/43 |
| 2016/0012775 A1* | 1/2016 | Jeong | G09G 3/3258 345/690 |
| 2016/0064412 A1* | 3/2016 | Choi | H01L 27/124 257/72 |
| 2016/0064420 A1* | 3/2016 | Choi | H01L 27/124 257/72 |
| 2016/0064465 A1* | 3/2016 | Oh | H01L 27/3262 257/43 |
| 2016/0079286 A1* | 3/2016 | Jin | H01L 29/66742 257/71 |
| 2016/0111453 A1* | 4/2016 | Lee | H01L 27/1248 257/72 |
| 2017/0033235 A1* | 2/2017 | Tsao | H01L 29/78618 |
| 2017/0098669 A1* | 4/2017 | Tsuno | H01L 27/1255 |
| 2017/0131585 A1* | 5/2017 | Cho | G02F 1/13338 |
| 2017/0155000 A1* | 6/2017 | Moon | H01L 29/78606 |
| 2017/0227825 A1* | 8/2017 | Iki | G02F 1/136213 |
| 2017/0263653 A1* | 9/2017 | Lu | H01L 27/1225 |
| 2017/0271376 A1* | 9/2017 | Murai | G02F 1/1368 |

* cited by examiner

PIXEL STRUCTURE AND RELATED FABRICATION METHOD

BACKGROUND

Technical Field

The present application relates to a pixel structure and a related fabrication method, and in particular, to a pixel structure with high resolution and a related fabrication method.

Related Art

With development of display science and technology, a demand for high definition of a display panel has increasingly grown on the market. However, in order to fabricate a high-definition display panel, it would be better if the area occupied by each pixel region is less. At present, limited to the process capability, a width between an electrode and a wire and a distance therebetween cannot be further shortened, such that it is not easy to reduce the area occupied by the pixel region, thereby limiting the resolution of the display panel. In view of this, how to effectively reduce the area occupied by each pixel region with the limited process capability is indeed an issue to be urgently solved in the industry.

SUMMARY

An objective of the present invention is to provide a high-resolution pixel structure and a related fabrication method that can break through the process limits.

An embodiment of the present invention provides a pixel structure disposed on a substrate and including a patterned semiconductor layer, a gate insulating layer, a first metal layer, a first insulating layer, a second metal layer, a second insulating layer, a third metal layer, a third insulating layer, and a pixel electrode. The patterned semiconductor layer is disposed on the substrate, and the gate insulating layer is disposed on the patterned semiconductor layer. The first metal layer is disposed on the gate insulating layer, wherein the first metal layer has at least one gate line and at least one gate, and the gate is electrically connected to the gate line. The first insulating layer is disposed on the first metal layer. The second metal layer is disposed on the first insulating layer, wherein the second metal layer has at least one first data line, at least one source, and at least one first drain, wherein the first data line is electrically connected to the source, and a first distance D1 is included between the first drain and the first data line in a first direction. The second insulating layer is disposed on the second metal layer, wherein the second insulating layer has at least one patterned opening disposed corresponding to the first drain, and the area of the patterned opening is substantially greater than the area of the first drain. The third metal layer has at least one second drain electrically connected to the first drain, wherein the second drain is disposed corresponding to the patterned opening and on the first drain, a second distance D2 is included between the second drain and the first data line in the first direction, and the second distance D2 is substantially less than the first distance D1. The third insulating layer is disposed on the third metal layer, and the pixel electrode is disposed on the third insulating layer, wherein the pixel electrode is electrically connected with the second drain.

Another embodiment of the present invention provides a pixel structure disposed on a substrate and including a patterned semiconductor layer, a gate insulating layer, a first metal layer, a first insulating layer, a second metal layer, a second insulating layer, a third metal layer, a third insulating layer, and a pixel electrode. The patterned semiconductor layer is disposed on the substrate, the gate insulating layer is disposed on the patterned semiconductor layer, and the first metal layer is disposed on the gate insulating layer, wherein the first metal layer has at least one gate line and at least one gate, and the gate is electrically connected to the gate line. The first insulating layer is disposed on the first metal layer. The second metal layer disposed on the first insulating layer, and the second metal layer has at least one drain, at least one first source, and at least one second source, wherein the first source and the second source are arranged side by side in a first direction, and a first distance D1 is included between the first source and the second source in the first direction. The second insulating layer is disposed on the second metal layer and the first insulating layer, wherein the second insulating layer has multiple patterned openings, and the patterned openings are disposed corresponding to the first source and the second source respectively. The third metal layer is disposed on the second metal layer, the second insulating layer, and the first insulating layer and disposed corresponding to the patterned openings, and the third metal layer has at least one first data line, at least one second data line, at least one third source, and at least one fourth source, wherein the first data line and the second data line are disposed corresponding to the patterned openings respectively in the first direction and disposed in parallel to each other on the first insulating layer, the third source and the fourth source are disposed corresponding to the patterned openings and on the first source and the second source, a second distance D2 is included between the third source and the fourth source in the first direction, and the first distance D1 is substantially greater than the second distance D2. The third insulating layer is disposed on the third metal layer, and the pixel electrode is disposed on the third insulating layer, wherein the pixel electrode is electrically connected with the drain.

DETAILED DESCRIPTION

To enable those of ordinary skill in the art to further understand the present invention, the composition content of the present invention and the effects to be achieved are described below in detail through preferred embodiments of the present invention and with reference to the accompanying drawings.

Figure 1:
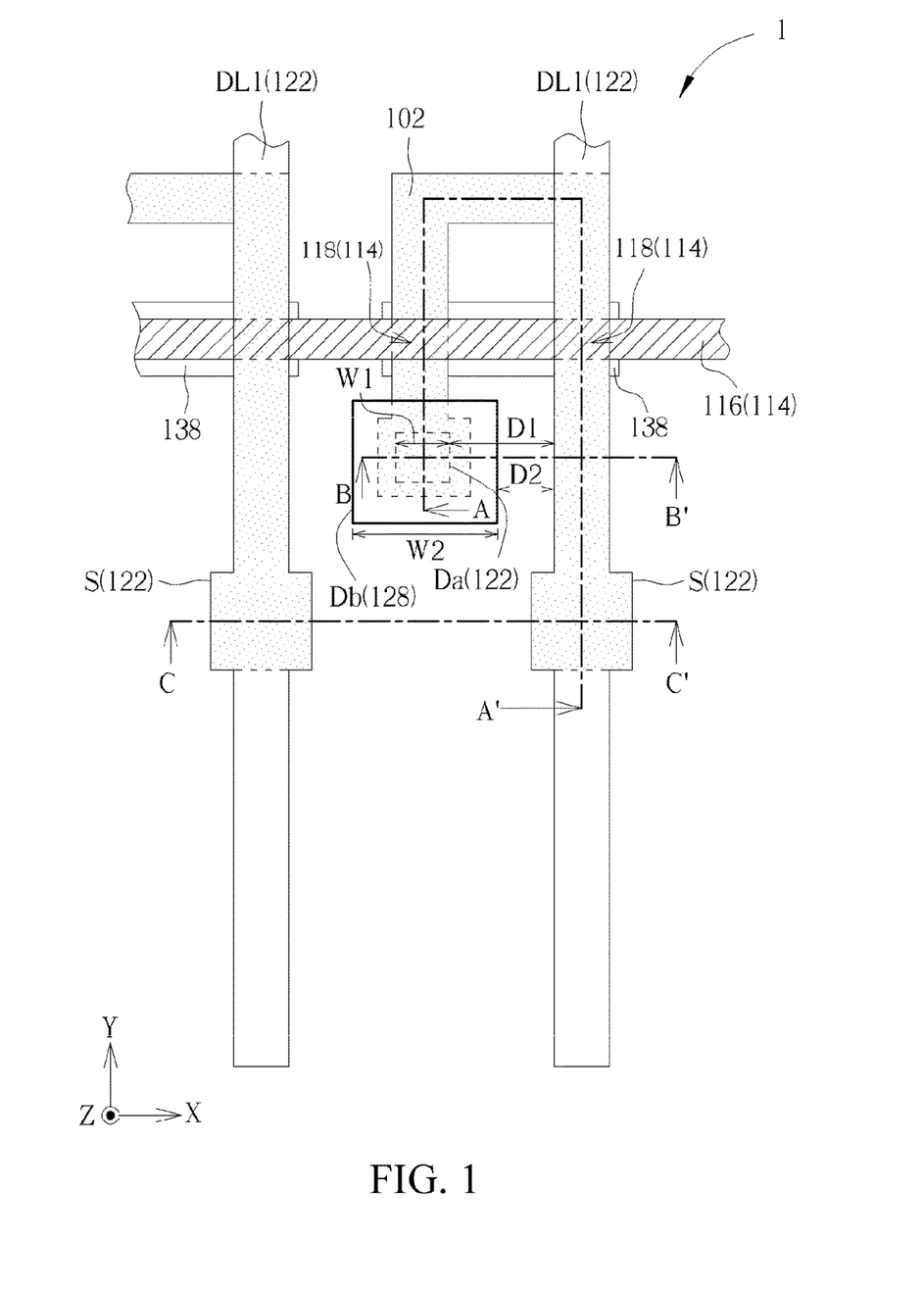
FIG. 1 is a schematic top view of a first embodiment of a pixel structure according to the present invention.
Figure 2:
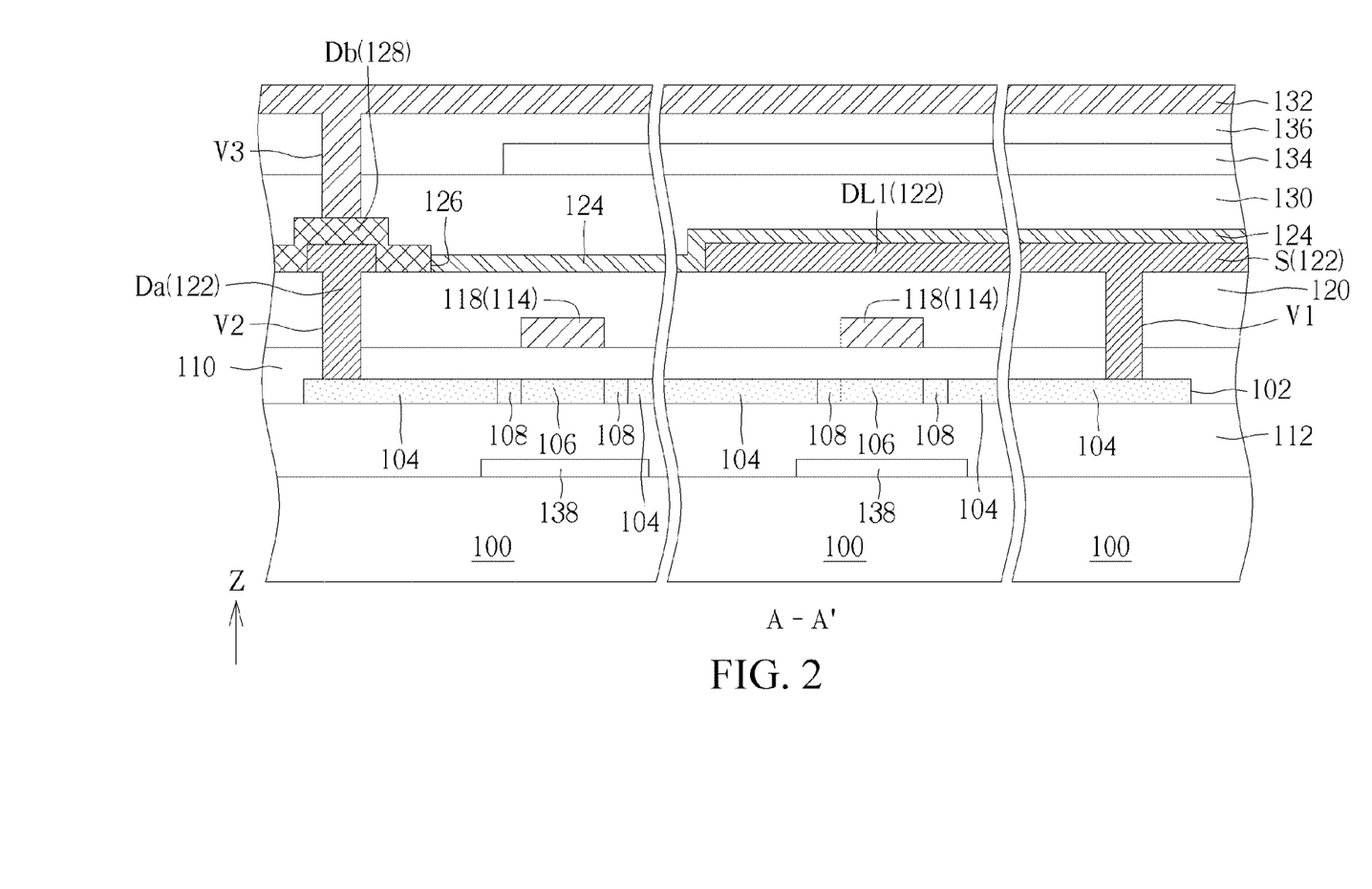
FIG. 2 is a schematic sectional diagram of the pixel structure shown in FIG. 1 along a section line A-A'.
Figure 3:
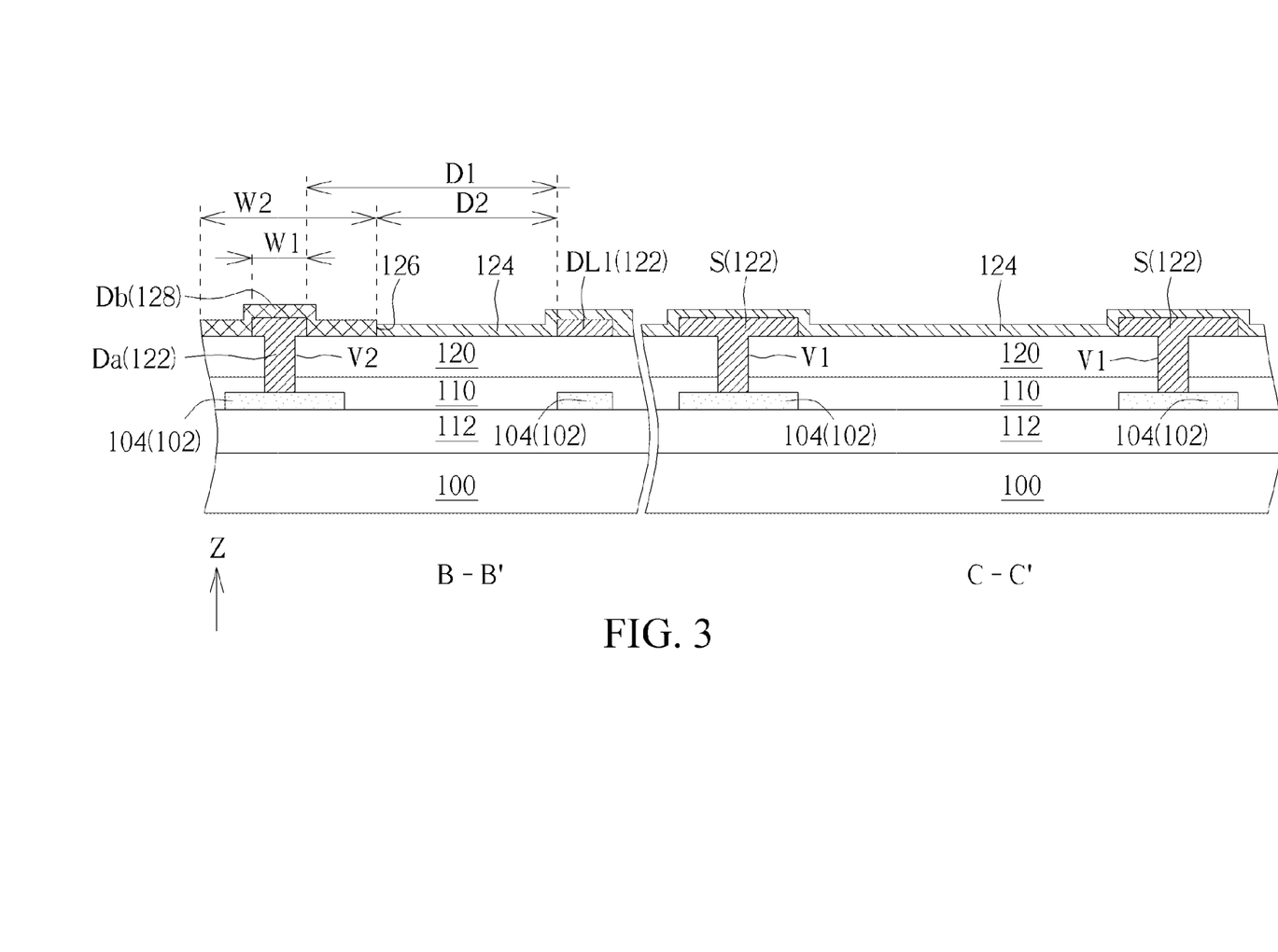
FIG. 3 is a schematic sectional diagram of the pixel structure shown in FIG. 1 along section lines B-B' and C-C'.

Referring to FIG. 1 to FIG. 3, FIG. 1 is a schematic top view of a first embodiment of a pixel structure according to the present invention, FIG. 2 is a schematic sectional diagram of the pixel structure shown in FIG. 1 along a section line A-A', and FIG. 3 is a schematic sectional diagram of the pixel structure shown in FIG. 1 along section lines B-B' and C-C'. To highlight the unique feature of the pixel structure 1 of this embodiment, FIG. 1 only depicts a patterned semiconductor layer 102, a first metal layer 114, a second metal layer 122, a third metal layer 128, and a shielding metal 138, while FIG. 3 omits a third insulating layer, a pixel electrode, a fourth insulating layer, and a common electrode. As shown in FIG. 1 to FIG. 3, the pixel structure 1 of this embodiment is disposed on a substrate 100, and the pixel structure 1 includes a patterned semiconductor layer 102, a gate insulating layer 110, a first metal layer 114, a first insulating layer 120, a second metal layer 122, a second insulating layer 124, a third metal layer 128, and a third insulating layer 130. The patterned semiconductor layer 102 is disposed on the substrate 100. The patterned semiconductor layer 102 of this embodiment is U-shaped, and is made of polycrystalline silicon, but is not limited thereto. The material of the patterned semiconductor layer 102 may be other suitable semiconductors, for example, other silicon-based semiconductors (e.g., amorphous silicon or microcrystalline silicon), oxide semiconductors (e.g., IGZO or other suitable oxide semiconductor materials) or other suitable semiconductor materials. The patterned semiconductor layer 102 includes three heavily doped regions 104, two channel regions 106, and four lightly doped regions 108. The channel regions 106 are located between two heavily doped regions 104 respectively, and the lightly doped regions 108 are disposed between the channel regions 106 and the heavily doped regions 104 respectively. Two ends of the patterned semiconductor layer 102 are each provided with a heavily doped region 104, which serve as a drain doped region and a source doped region respectively. In addition, a buffer layer 112 may be selectively disposed between the patterned semiconductor layer 102 and the substrate 100, the material thereof may include silicon oxide, silicon nitride, silicon oxynitride or other insulating materials, and the buffer layer 112 may be a single-layer structure or a composite-layer structure.

The gate insulating layer 110 is disposed on the patterned semiconductor layer 102, and the first metal layer 114 is disposed on the gate insulating layer 110. The gate insulating layer 110 may include a single-layer structure or a composite-layer structure, and the material thereof may include an inorganic insulating material, for example, silicon oxide, silicon nitride, silicon oxynitride, oxidized graphene, graphene nitride, or nitrogen oxide grapheme, or an organic insulating material (for example, polyimide, (PI), Acrylic resin, benzocyclpbutene (BCB) or other suitable materials). The first metal layer 114 has at least one gate line 116 and at least one gate 118, and the gate 118 is electrically connected to the gate line 116. The gate line 116 of this embodiment substantially extends along a first direction X, and the gate 118 is directly connected to the gate line 116. The pixel structure 1 of this embodiment may include two gates 118 overlapping with two channel regions 106 in a vertical projection direction Z respectively, wherein the vertical projection direction Z, for example, is a direction perpendicular to a surface of the substrate 100. The material of the first metal layer 114 includes Mo, Ti or other metal materials, a metal alloy, for example, MoN, a combination of the materials, or other conductive materials having low resistance. In addition, the first metal layer 114 may be a single-layer structure or a composite-layer structure. In other embodiments, the first metal layer 114 may also be replaced with a transparent conductive material.

The first insulating layer 120 is disposed on the first metal layer 114, and the second metal layer 122 is disposed on the first insulating layer 120. The second metal layer 122 has at least one first data line DL1, at least one source S, and at least one first drain Da. The first data line DL1 substantially extends along a second direction Y, and intersects with the gate line 116. An angle of 90 degrees is included between the first direction X and the second direction Y of this embodiment, but is not limited thereto. The source S is connected to the heavily doped region 104 at one end of the patterned semiconductor layer 102 via a first contact hole V1 in the first insulating layer 120, and the first drain Da is connected to the heavily doped region 104 at the other end of the patterned semiconductor layer 102 via a second contact hole V2 in the first insulating layer 120. The first data line DL1 is connected to the source S for electrical connection. A first distance D1 is included between the first drain Da and the first data line DL1 in the first direction X. In addition, the first drain Da has a contact (for example, the top of the first drain Da) covering the second contact hole V2, and the area of the contact is substantially equal to the opening area of the second contact hole V2, but is not limited thereto. In a varying embodiment, the area of the contact may also be greater than the opening area of the second contact hole V2. The material of the first insulating layer 120 may be an organic insulating material or inorganic insulating material, and the first insulating layer 120 may be a single-layer structure or a composite-layer structure. The related material may be selected from the material of the gate insulating layer 110, which is not repeated herein. The second metal layer 122 may be a single-layer structure or a composite-layer structure, and the related material may be selected from the material of the first metal layer 114, which is not repeated herein.

The second insulating layer 124 is disposed on the second metal layer 122, wherein the second insulating layer 124 at least has a patterned opening 126 disposed corresponding to the first drain Da, and the area of the patterned opening 126 is substantially greater than the area of the first drain Da. In other words, the second insulating layer 124 does not cover the first drain Da, but covers the first data line DL1 and the source S. The third metal layer 128 has a second drain Db disposed corresponding to the patterned opening 126 and disposed on the first drain Da, wherein the second drain Db covers a top surface and a sidewall of the first drain Da, thereby electrically connecting the second drain Db with the first drain Da. In other words, in this embodiment, the third metal layer 128 does not cover the source S and the first data line DL1. The patterned semiconductor layer 102, the gate 118, the source S, the first drain Da, and the second drain Db of this embodiment constitute a switch element. In addition, a second distance D2 is included between the second drain Db and the first data line DL1 in the first direction X, the second distance D2 is substantially less than the first distance D1, wherein the second distance D2 and the first distance D1 have a distance difference P, and the distance difference P is greater than or equal to 2 microns, but is not limited thereto. Moreover, the first drain Da has a first line width W1, the second drain has a second line width W2, and the second line width W2 is substantially greater than the first line width W1. In this embodiment, the second line width W2 and the first line width W1 have a ratio R (e.g., R=(W2/W1)), and the ratio R satisfies $3 \geq R \geq 1.5$. In addition, the material of the second insulating layer 124 may be an organic insulating material or inorganic insulating material, and the second insulating layer 124 may be a single-layer structure or a composite-layer structure. The related material may be selected from the material of the gate insulating layer 110, which is not repeated herein. The third metal layer 128 may be a single-layer structure or a composite-layer structure, and the related material may be selected from the material of the first metal layer 114, which is not repeated herein.

As shown in FIG. 2, the third insulating layer 130 is disposed on the third metal layer 128, and the pixel electrode 132 is disposed on the third insulating layer 130. The pixel structure 1 of this embodiment further includes a common electrode 134 and a fourth insulating layer 136. The common electrode 134 is disposed on the third insulating layer 130, the pixel electrode 132 is disposed on the fourth insulating layer 136, and the fourth insulating layer 136 is disposed between the common electrode 134 and the pixel electrode 132, which is not limited thereto. The pixel electrode 132 of this embodiment is electrically connected to the second drain Db via third contact holes V3 in the third insulating layer 130 and the fourth insulating layer 136, thus causing the pixel electrode 132 to be electrically connected to the switch element. The material of the third insulating layer 130 and the fourth insulating layer 136 may be an organic insulating material or inorganic insulating material, and the third insulating layer 130 and the fourth insulating layer 136 may be a single-layer structure or a composite-layer structure. The related material may be selected from the material of the gate insulating layer 110, which is not repeated herein. The material of the pixel electrode 132 and the common electrode 134 may include a transparent conductive material, for example, ITO, IZO, graphene and so on. In a varying embodiment, the upper-and-lower-layer setting relation between the pixel electrode 132 and the common electrode 134 may be interchanged. In addition, the pixel structure 1 of this embodiment further includes a shielding metal 138 disposed between the substrate 100 and the buffer layer 112, the shielding metal 138 may be a metal segment extending along the first direction X, and overlap with the channel regions 106 and the lightly doped regions 108 of the patterned semiconductor layer 102 in a vertical projection direction Z, to prevent the channel regions 106 and the lightly doped regions 108 from being irradiated on and thus to affect the overall efficiency.

Figure 4:
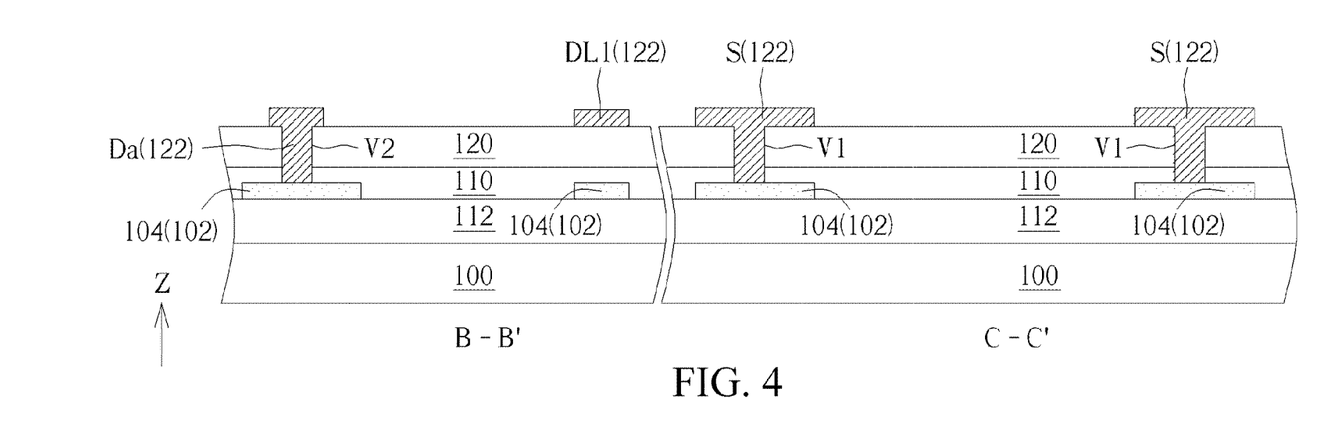
FIG. 4 and FIG. 5 are schematic diagrams of a process of a fabrication method of a first embodiment of a pixel structure.
Figure 5:
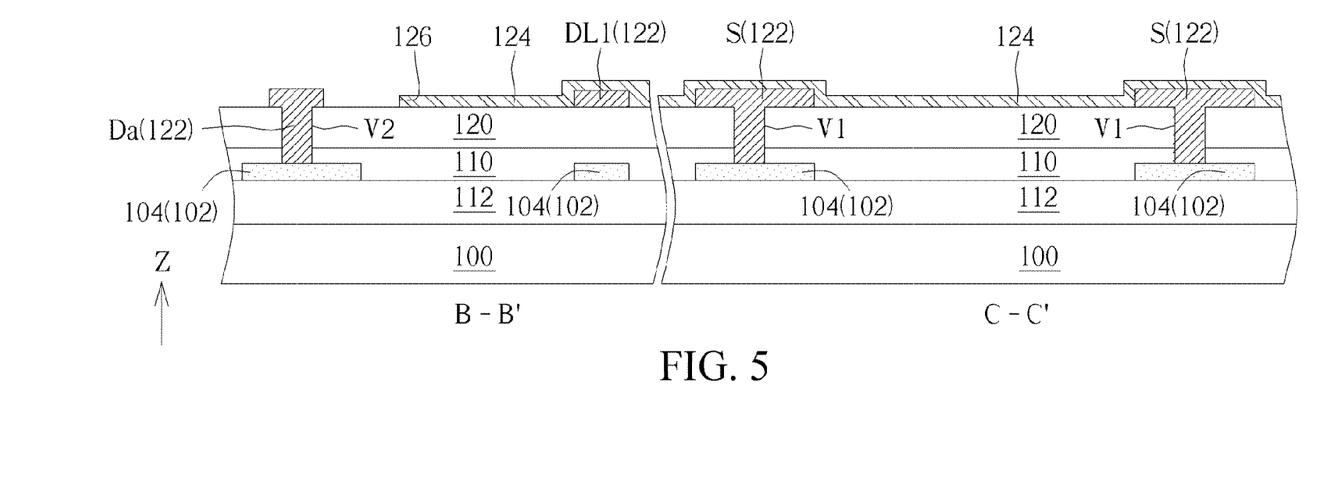

Referring to FIG. 4 and FIG. 5, they are schematic diagrams of a process of a fabrication method of a first embodiment of a pixel structure according to the present invention, and the sectional positions of FIG. 4 and FIG. 5 correspond to FIG. 3. As shown in FIG. 4, firstly, a substrate 100 is provided, and a shielding metal 138 (not shown in FIG. 4 and FIG. 5) and a buffer layer 112 are selectively formed on the substrate 100. Next, a semiconductor material layer is fully formed on the buffer layer 112, and a patterned semiconductor layer 102 is formed by a patterning process (e.g., lithographic and etching process). Then, channel regions 106 (only shown in FIG. 2), lightly doped regions 108 (only shown in FIG. 2) and heavily doped regions 104 may be formed respectively in the patterned semiconductor layer 102 by, for example, a doping process or an ion implantation process. Next, a gate insulating layer 110 is formed on the patterned semiconductor layer 102. In addition, a first metal layer 114 (only shown in FIG. 2) is formed on the gate insulating layer 110, and the first metal layer 114 may form a gate line 116 and a gate 118 by, for example, a lithographic and etching process. Next, a first insulating layer 120 is formed on the gate insulating layer 110, and a first contact hole V1 and a second contact hole V2 are formed in the first insulating layer 120 by, for example, a lithographic and etching process, to respectively expose some top surfaces of the heavily doped regions 104. Then, a second metal layer 122 is formed on the first insulating layer 120. The second metal layer 122 may form a source S, a first data line DL1, and a first drain Da by, for example, a lithographic and etching process, wherein the second metal layer 122 is filled in the first contact hole V1 to contact a heavily doped region 104 to form the source S, and the second metal layer 122 is also filled in the second contact hole V2 to contact another heavily doped region 104 to form the first drain Da, and the area of the source S in this embodiment is greater than the opening area of the first contact hole V1 and is also greater than the area of the first drain Da.

As shown in FIG. 5, next, a second insulating layer 124 is formed on the second metal layer 122 and the first insulating layer 120, and a patterned opening 126 may be formed in the second insulating layer 124 by, for example, a lithographic and etching process, wherein the patterned opening 126 is formed only corresponding to the position of the first drain Da, and the area of the patterned opening 126 is greater than that of the first drain Da, so that one end of the first drain Da may be exposed by the patterned opening 126. Referring to FIG. 3, next, a third metal layer 128 is formed, which can be filled in the patterned opening 126 and form a second drain Db by, for example, a lithographic and etching process, wherein the second drain Db covers the first drain Da. In addition, referring to FIG. 2, after the second drain Db is fabricated, a third insulating layer 130, a common electrode 134, a fourth insulating layer 136, and a pixel electrode 132 may be sequentially formed on the third metal layer 128, wherein a third contact hole V3 may be formed in the third insulating layer 130 and the fourth insulating layer 136 by, for example, a lithographic and etching process, and the pixel electrode 132 is filled in the third contact hole V3 to be connected with the second drain Db.

According to this embodiment, the pixel structure 1 has a first drain Da and a second drain Db, wherein the first drain Da and the first data line DL1 are both the second metal layer 122, and may be fabricated together from the same process. The first drain Da and the second drain Db are composed of different metal layers, and are fabricated separately from different processes. Thus, the second drain Db and the first data line DL1 may be fabricated separately, avoiding that the minimum distance between the second drain Db and the first data line DL1 is limited due to the limitation to the process capability, such that the area of the pixel region can be reduced and the resolution of the display panel can be enhanced.

The pixel structure of the present invention is not limited to the above embodiment. The pixel structure in other embodiments of the present invention will be introduced hereinafter sequentially, and in order to facilitate comparison between differences and similarities of the embodiments and simplify the description, identical symbols are used in the following embodiments to mark identical elements, and differences and similarities of the embodiments are mainly described, but repeated contents are no longer described.

Figure 6:
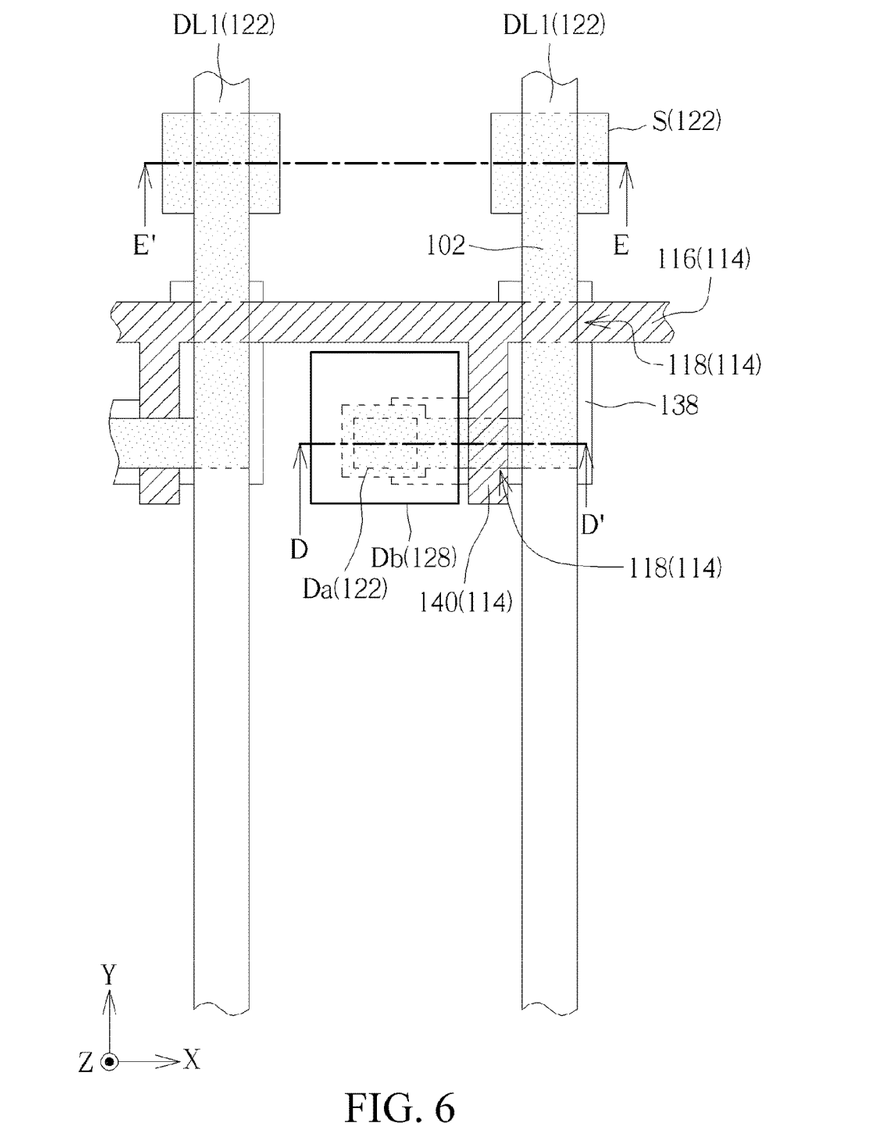
FIG. 6 is a schematic top view of a second embodiment of a pixel structure according to the present invention.
Figure 7:
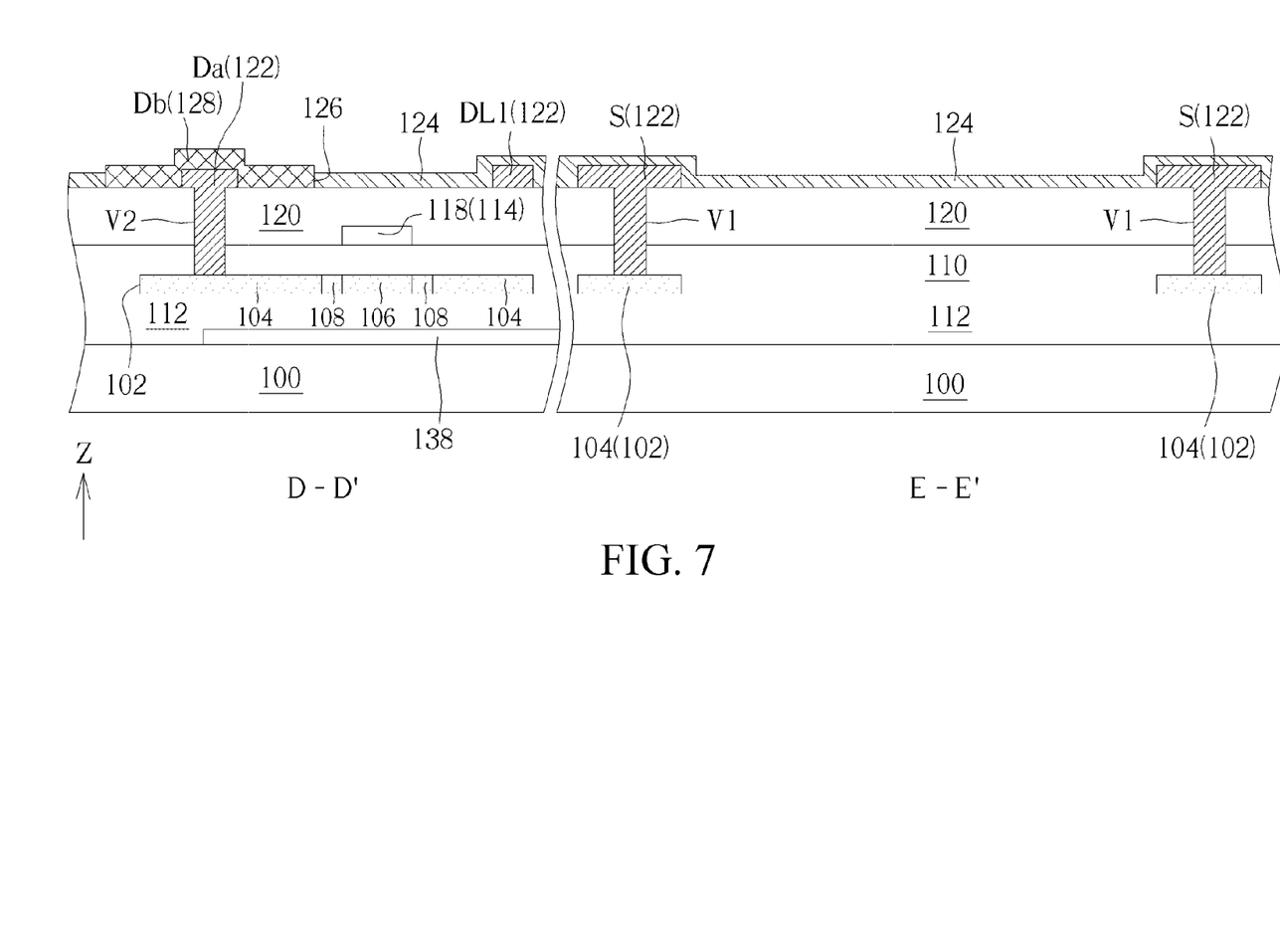
FIG. 7 is a schematic sectional diagram of the pixel structure shown in FIG. 6 along section lines D-D' and E-E'.

Referring to FIG. 6 and FIG. 7, FIG. 6 is a schematic top view of a second embodiment of a pixel structure according to the present invention, and FIG. 7 is a schematic sectional diagram of the pixel structure shown in FIG. 6 along section lines D-D' and E-E'. As shown in FIG. 6 and FIG. 7, this embodiment is different from the first embodiment in that the shape of the patterned semiconductor layer 102 is L-shaped, and two ends of the patterned semiconductor layer 102 are located on two sides of the gate line 116 respectively, that is, two heavily doped regions 104, as a drain doped region and a source doped region, are located on two sides of the gate line 116 respectively. In other words, the source S, the first drain Da and the second drain Db of this embodiment are also located on two sides of the gate line 116. In this embodiment, the shielding metal 138 is also L-shaped, and partially overlaps with the patterned semiconductor layer 102 in the vertical projection direction Z. In addition, the first metal layer 114 of this embodiment further includes a branch 140 connected to the gate line 116 and extending along a second direction Y, to serve as the gate 118 of the switch element in this embodiment, wherein the branch 140 is disposed between the second drain Db and the first data line DL1 in the first direction X. It should be noted that the gate line 116 intersects with the first data line DL1, the gate line 116 at the intersection also serves as the gate 118 (as shown in the figure) of the switch element in this embodiment, and reference may be made to first embodiment for the patterned semiconductor layer 102 therebelow, which is not repeated. Reference can be made to the first embodiment for the remaining features such as materials and relative positions, of the elements in this embodiment and the fabrication method, which are not repeated.

Figure 8:
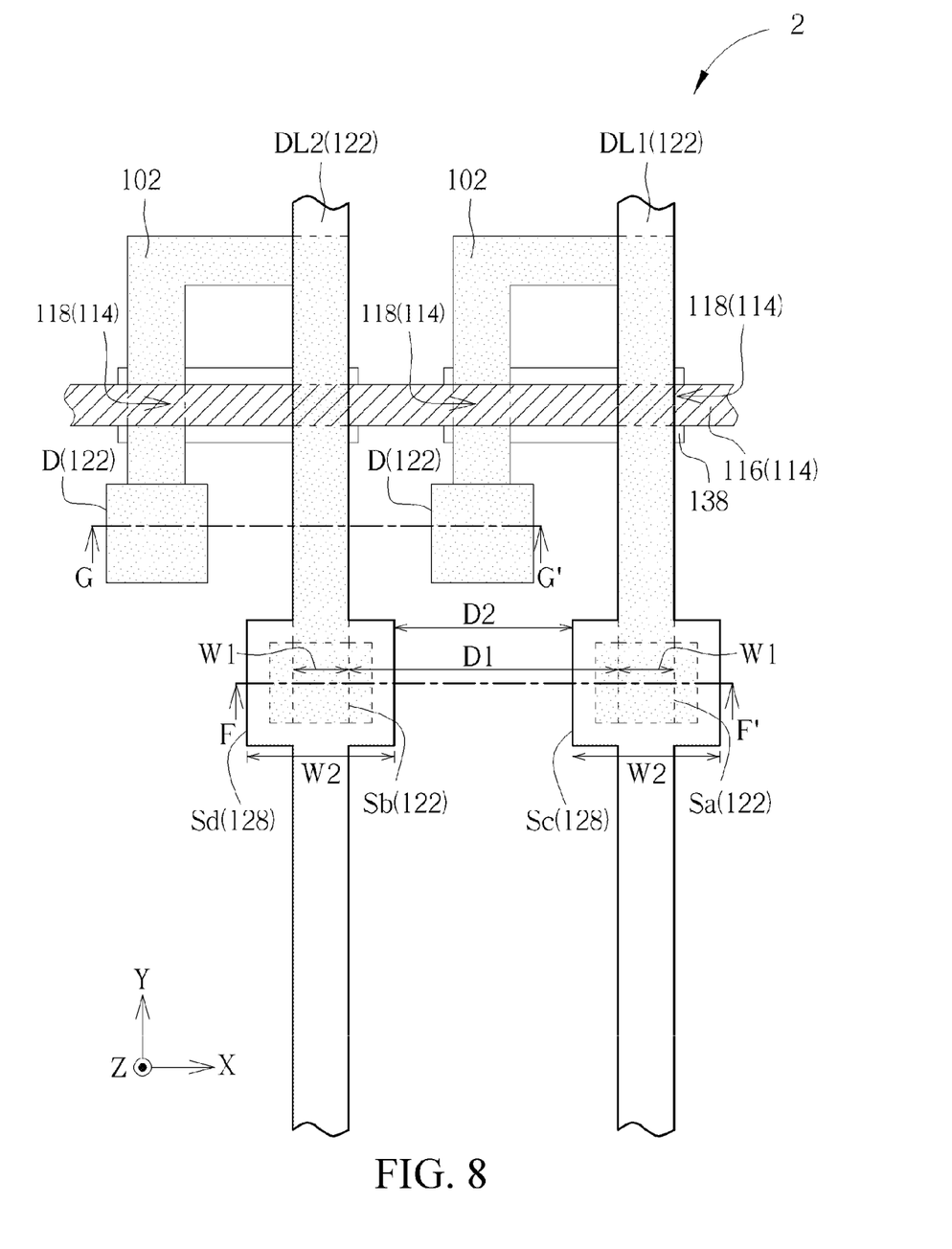
FIG. 8 is a schematic top view of a third embodiment of a pixel structure according to the present invention.
Figure 9:
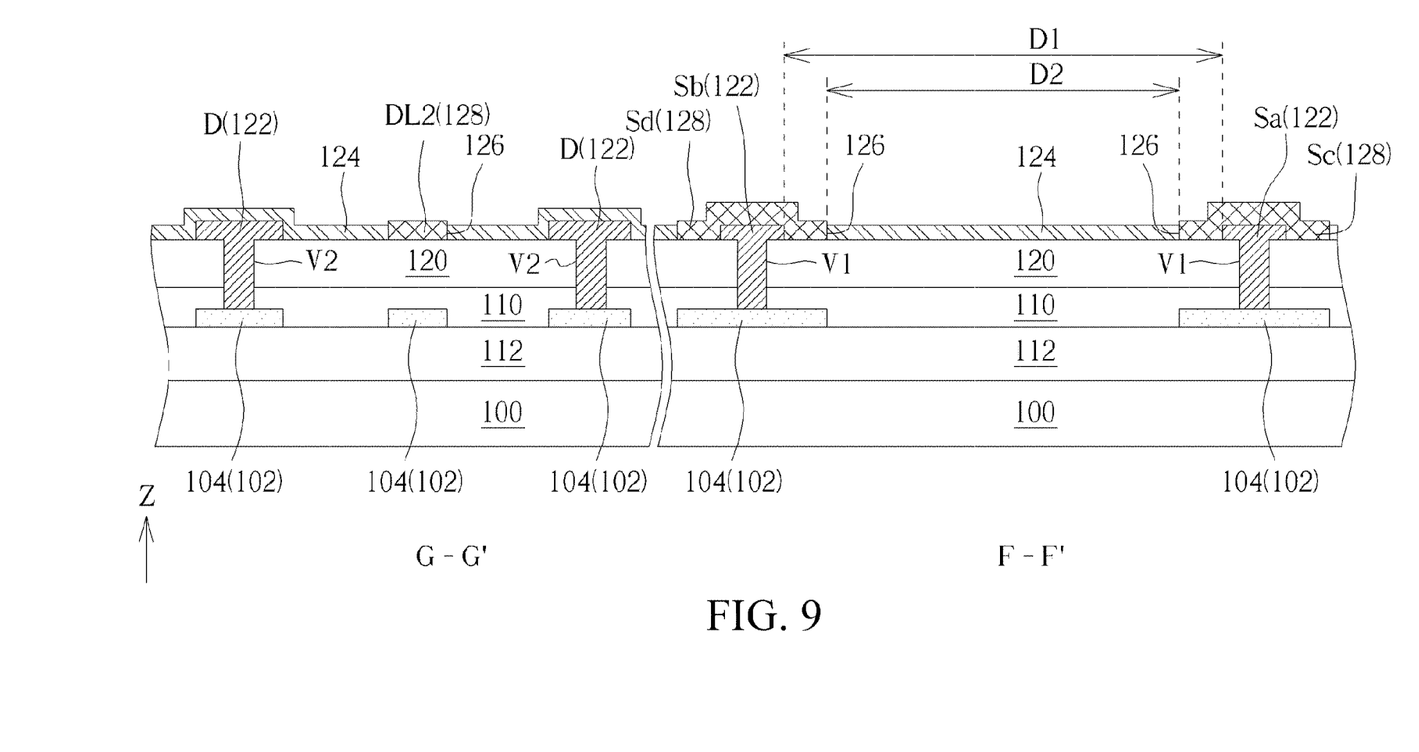
FIG. 9 is a schematic sectional diagram of the pixel structure shown in FIG. 8 along section lines F-F' and G-G'.

Referring to FIG. 8 and FIG. 9, FIG. 8 is a schematic top view of a third embodiment of a pixel structure according to the present invention, and FIG. 9 is a schematic sectional diagram of the pixel structure shown in FIG. 8 along section lines F-F' and G-G'. As shown in FIG. 8 and FIG. 9, the second metal layer 122 and the third metal layer 128 of this embodiment have patterns different from those in the first embodiment, wherein the second metal layer 122 has at least one drain D, at least one first source Sa, and at least one second source Sb, and the third metal layer 128 has at least one third source Sc and at least one fourth source Sd. The source S, the at least one first source Sa, and the at least one second source Sb are separated from each other, and the third source Sc and the at least one fourth source Sd are separated from each other. As shown in FIG. 8, it depicts two pixel regions disposed adjacent to each other along the first direction X, the drain D of each pixel region is electrically connected to the corresponding heavily doped region 104 of the patterned semiconductor layer 102 respectively via the second contact hole V2, the first source Sa of the right pixel region is electrically connected to the corresponding heavily doped region 104 of the patterned semiconductor layer 102 via the first contact hole V1, and the second source Sb of the left pixel region is electrically connected to the heavily doped region 104 of another patterned semiconductor layer 102 via another first contact hole V1. Moreover, the first source Sa and the second source Sb are arranged side by side in the first direction X, and a first distance D1 is included between the first source Sa and the second source Sb in the first direction X. In addition, the first source Sa and the second source Sb each have a contact (e.g., top end) covering the corresponding first contact hole V1, and the area of the contact is substantially equal to the opening area of the first contact hole V1, which is not limited thereto.

A patterned opening 126 of the second insulating layer 124 in this embodiment is disposed corresponding to the first source Sa and the second source Sb respectively, and the area of the patterned opening 126 is substantially greater than the area of the first source Sa and the second source Sb. In other words, the second insulating layer 124 does not cover the first source Sa and the second source Sb, but covers the drain D. The third source Sc and the fourth source Sd of the third metal layer 128 are disposed corresponding to the patterned opening 126 and on the first source Sa and the second source Sb respectively, wherein the third source Sc covers a sidewall and a top surface of the first source Sa, causing the third source Sc to be electrically connected to the first source Sa, and the fourth source Sd covers a sidewall and a top surface of the second source Sb, causing the fourth source Sd to be electrically connected to the second source Sb. The first source Sa and the second source Sb have a first line width W1, the third source Sc and the fourth source Sd have a second line width W2, the second line width W2 is substantially greater than the first line width W1, and the second line width W2 and the first line width W1 have a ratio R (e.g., R=(W1/W2)), and the ratio R satisfies 3≥R≥1.5. In addition, a second distance D2 is included between the third source Sc and the fourth source Sd in the first direction X, and the first distance D1 is substantially greater than the second distance D2, wherein the first distance D1 and the second distance D2 satisfy D1≤(Q*D2), and Q≥2. Besides, the patterned opening 126 further extends outwards along the second direction Y from the positions of the first source Sa and the second source Sb respectively, to define the position where the data line is set. The third metal layer 128 further has at least one first data line DL1 and at least one second data line DL2 which belong to left and right pixel regions respectively, wherein the first data line DL1 and the second data line DL2 are disposed corresponding to the patterned opening 126 respectively in the first direction X and disposed in parallel to each other on the first insulating layer 120, the first data line DL1 is connected to the third source Sc, and the second data line DL2 is connected to the fourth source Sd, but the at least one first data line DL1 and the at least one second data line DL2 are separated from each other. In other words, the first source Sa and the third source Sc are electrically connected to the first data line DL1 of the right pixel region, and the second source Sb and the fourth source Sd are electrically connected to the second data line DL2 of the left pixel region, which are not limited thereto.

In addition, like the first embodiment, in this embodiment, a third insulating layer 130, a common electrode 134, a fourth insulating layer 136, and a pixel electrode 132 (as shown in FIG. 2) are disposed on the third metal layer 128. As this embodiment does not have a first source and a second source, the pixel electrode 132 may be directly connected to the drain D of this embodiment via the third contact hole V3 in the third insulating layer 130 and the fourth insulating layer 136 shown in FIG. 2.

Figure 10:
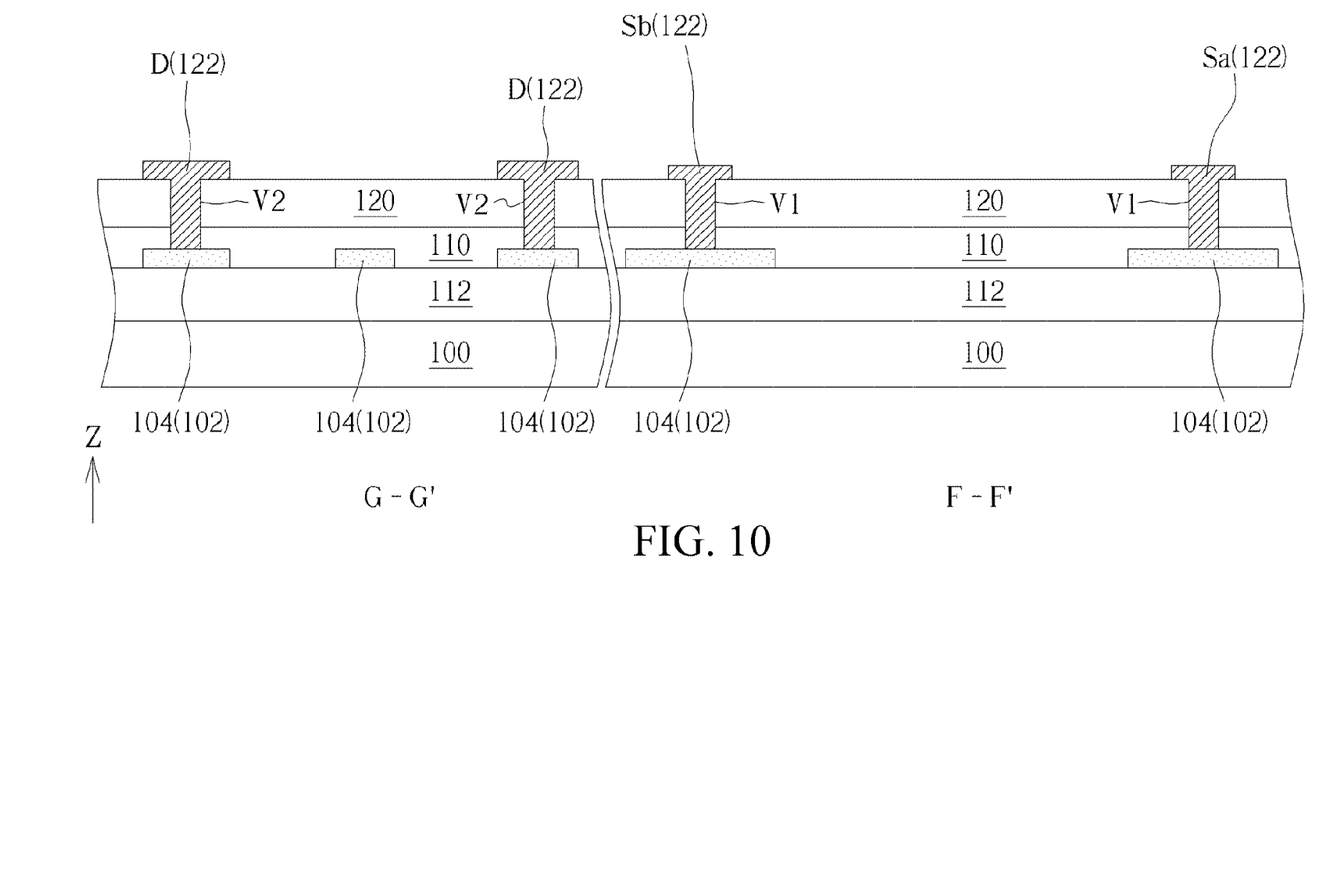
FIG. 10 and FIG. 11 are schematic flow charts of a fabrication method of a third embodiment of a pixel structure.
Figure 11:
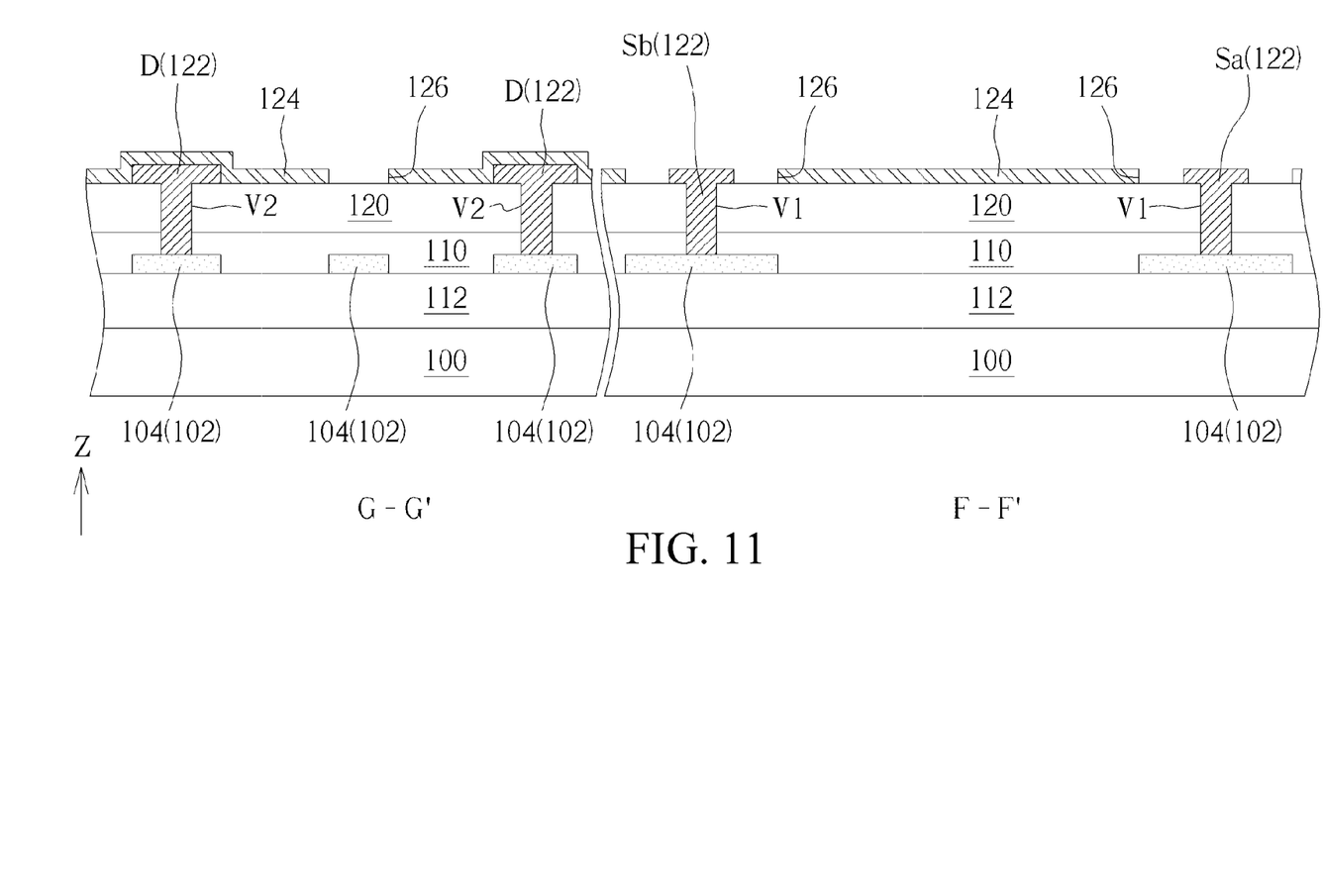

FIG. 10 and FIG. 11 are schematic flow charts of a fabrication method of a third embodiment of a pixel structure. Section positions of FIG. 10 and FIG. 11 correspond to FIG. 9. Steps of the fabrication method of this embodiment prior to forming the second metal layer 122 are identical with those in the first embodiment, which are not repeated herein. As shown in FIG. 10, the second metal layer 122 is formed on the first insulating layer 120, the second metal layer 122 may form a drain D, a first source Sa and a second source Sb by, for example, a lithographic and etching process, wherein the second metal layer 122 is filled in the second contact hole V2 to contact the corresponding heavily doped region 104 to form the drain D, and is further filled different first contact holes V1 to contact the corresponding heavily doped regions 104 to form the first source Sa and the second source Sb respectively, wherein the first source Sa and the second source Sb are in contact with the heavily doped regions 104 of two adjacent patterned semiconductor layer 102 respectively.

As shown in FIG. 11, next, a second insulating layer 124 is formed on the second metal layer 122 and the first insulating layer 120, and a patterned opening 126 may also be formed in the second insulating layer 124 by, for example, a lithographic and etching process, wherein the patterned opening 126 is correspondingly formed on the positions of the first source Sa and the second source Sb, and the area of the patterned opening 126 is greater than that of the first source Sa and the second source Sb, enabling one end of the first source Sa and one end of the second source Sb to be exposed by the patterned opening 126 respectively. In addition, the patterned opening 126 can further extend outwards from the positions of the first source Sa and the second source Sb (e.g., extend along the second direction Y), to serve as the position where a first data line DL1 and a second data line DL2 are formed subsequently.

Referring to FIG. 9, next, a third metal layer 128 is formed, which may be filled in the patterned opening 126 and, by, for example, a lithographic and etching process, form a third source Sc, a fourth source Sd, a first data line DL1, and a second data line DL2. The area of the third source Sc and the fourth source Sd is greater than that of the first source Sa and the second source Sb, and the third source Sc and the fourth source Sd cover top surfaces and side surfaces of the first source Sa and the second source Sb respectively. In this embodiment, the first data line DL1 and the second data line DL2 are connected to the third source Sc and the fourth source Sd respectively, and the third source Sc, the fourth source Sd, the first data line DL1, and the second data line DL2 may be fabricated by the same process. In addition, the fabrication method after the third metal layer 128 is formed in this embodiment is substantially the same as that in the first embodiment, and reference can be made to FIG. 2. The difference merely lies in that this embodiment does not include the first source and the second source, and the pixel electrode 132 is filled in the third contact hole V3 to be connected to the drain D.

According to this embodiment, the pixel structure 2 has a first source Sa, a second source Sb, a third source Sc, and a fourth source Sd, wherein the first source Sa and the second source Sb are both the second metal layer 122, and the third source Sc and the fourth source Sd are both the third metal layer 128, and the first source Sa and the second source Sb as well as the third source Sc and the fourth source Sd are made by different processes respectively. With the design of separate fabrication of the first source Sa and the second source Sb as well as the third source Sc and the fourth source Sd, a distance between sources adjacent to each other and side by side can be further reduced, the first source Sa and the third source Sc may be, for example, sources of a pixel region, and the second source Sb and the fourth source Sd may be, for example, sources of another pixel region. In other words, the design of this embodiment can reduce the area of the pixel regions and the distance between pixel regions, thus enhancing the resolution of the display panel.

Figure 12:
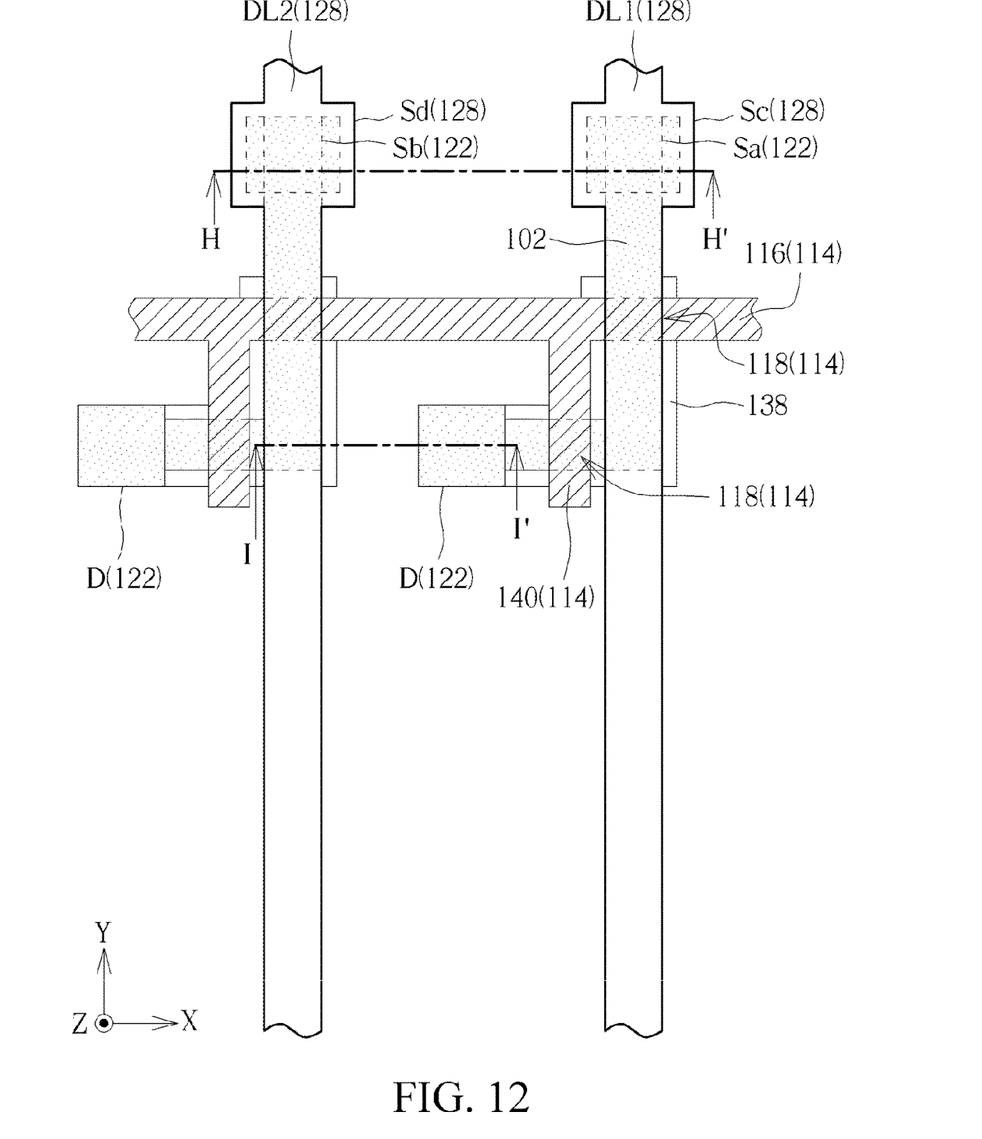
FIG. 12 is a schematic top view of a fourth embodiment of a pixel structure according to the present invention.
Figure 13:
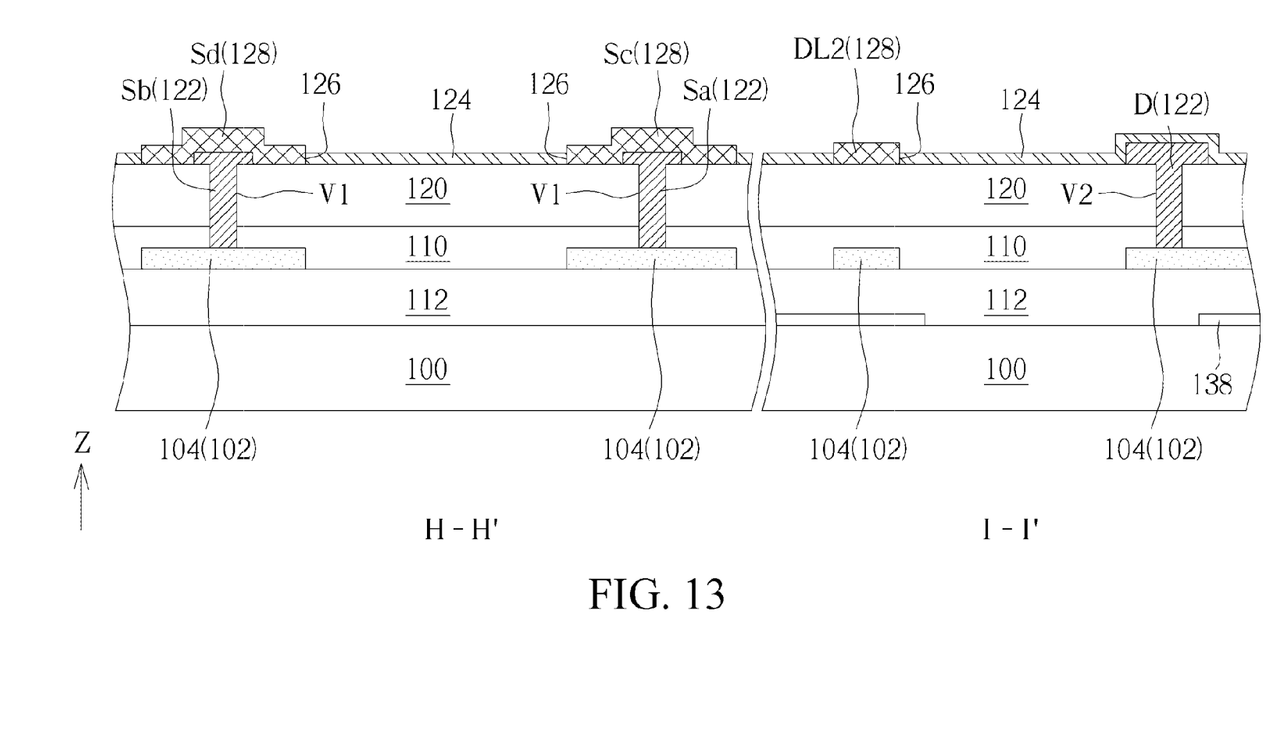
FIG. 13 is a schematic sectional diagram of the pixel structure shown in FIG. 12 along section lines H-H' and I-I'.

Referring to FIG. 12 and FIG. 13, FIG. 12 is a schematic top view of a fourth embodiment of a pixel structure according to the present invention, and FIG. 13 is a schematic sectional diagram of the pixel structure shown in FIG. 12 along section lines H-H' and I-I'. As shown in FIG. 12 and FIG. 13, this embodiment is different from the third embodiment in that the patterned semiconductor layer 102 is L-shaped, and two ends of the patterned semiconductor layer 102 are located at two sides of the gate line 116 respectively in a second direction Y, that is, two heavily doped regions 104 as a drain doped region and a source doped region are located at two sides of the gate line 116 respectively. In other words, in this embodiment, the first source Sa, the second source Sb, the third source Sc, and the fourth source Sd are located at one side of the gate line 116, while the drain D is located at the other side of the gate line 116. In this embodiment, the shielding metal 138 is also L-shaped, and partially overlaps with the patterned semiconductor layer 102 in a vertical projection direction Z. In addition, the first metal layer 114 in this embodiment further includes a branch 140 connected to the gate line 116 and extending along the second direction Y, to serve as a gate 118 of the switch element of this embodiment, wherein the branch 140 is disposed between the drain D and the first data line DL1 in the first direction X. It should be noted that, if the gate line 116 intersects with the first data line DL1, the gate line 116 at the intersection also serves as a gate 118 of the switch element of this embodiment (as shown in the figure), and reference can be made to the third embodiment for the patterned semiconductor layer 102 therebelow, which is not repeated. Reference can be made to the third embodiment for the remaining features such as materials and relative positions, of the elements in this embodiment and the fabrication method, which are not repeated.

To sum up, the source or drain in the pixel structure of the present invention is composed of two different metal layers, and thus the source or drain can be fabricated by two processes. When the drain is composed of a first drain and a second drain, the first data line and the first drain are composed of the same metal layer, and the second drain is composed of another meal layer different from the first data line and the first drain. Therefore, the second drain and the first data line are formed by different processes. In this case, the distance between the second drain and the first data line is not necessarily limited to process limits, which can thus further reduce the distance between them, to reduce the overall area of the pixel region and improve the resolution. In addition, when the first source and the third source electrically connected to the first data line are composed of different metal layers and the second source and the fourth source electrically connected to the second data line are also composed of different metal layers, as different metal layers are formed by different processes, the distance between sources of two adjacent pixel regions can be further reduced by the third source and the fourth source, such that the area of the pixel region can be reduced to improve the resolution.

The above descriptions are merely preferred embodiments of the present invention. Any equivalent variation and modification made within the scope of the present invention shall belong to the scope encompassed by the present invention.

What is claimed is:
1. A pixel structure, disposed on a substrate, comprising:
   a patterned semiconductor layer disposed on the substrate;
   a gate insulating layer disposed on the patterned semiconductor layer;

a first metal layer disposed on the gate insulating layer, wherein the first metal layer has at least one gate line and at least one gate, and the gate is electrically connected to the gate line;

a first insulating layer disposed on the first metal layer;

a second metal layer disposed on the first insulating layer, wherein the second metal layer has at least one first data line, at least one source, and at least one first drain, wherein the first data line is electrically connected to the source, and the first drain and the first data line are distanced away from each other for a first distance D1 in a first direction;

a second insulating layer disposed on the second metal layer, wherein the second insulating layer has at least one patterned opening disposed corresponding to the first drain, and the patterned opening is larger than the first drain;

a third metal layer, having at least one second drain electrically connected to the first drain, wherein the second drain is disposed corresponding to the patterned opening and on the first drain, the second drain and the first data line are distanced away from each other for a second distance D2 in the first direction, and the second distance D2 is less than the first distance D1;

a third insulating layer disposed on the third metal layer; and a pixel electrode disposed on the third insulating layer, wherein the pixel electrode is electrically connected with the second drain.

2. The pixel structure according to claim 1, wherein the first distance D1 is subtracted from the second distance D2 to obtain a distance difference P, and the distance difference P is greater than or equal to 2 microns.

3. The pixel structure according to claim 1, wherein the second insulating layer covers the source and the first data line.

4. The pixel structure according to claim 1, wherein the first drain has a first line width W1, the second drain has a second line width W2, and the second line width W2 is greater than the first line width W1.

5. The pixel structure according to claim 4, wherein the second line width W2 and the first line width W1 have a ratio R, and the ratio R satisfies $3 \geq R \geq 1.5$.

6. The pixel structure according to claim 1, wherein the first data line extends along a second direction, the gate line along the first direction, and the first data line intersects with the gate line.

7. A pixel structure, disposed on a substrate, comprising:
a patterned semiconductor layer disposed on the substrate;
a gate insulating layer disposed on the patterned semiconductor layer;
a first metal layer disposed on the gate insulating layer, wherein the first metal layer has at least one gate line and at least one gate, and the gate is electrically connected to the gate line;
a first insulating layer disposed on the first metal layer;

a second metal layer disposed on the first insulating layer, having at least one drain, a first source, and a second source, wherein the first source and the second source are arranged side by side in a first direction and distanced away from each other for a first distance D1;

a second insulating layer disposed on the second metal layer and the first insulating layer, wherein the second insulating layer has multiple patterned openings, and the patterned openings are disposed corresponding to the first source and the second source respectively;

a third metal layer disposed on the second metal layer, the first insulating layer, and the second insulating layer, wherein the third metal layer is disposed corresponding to the patterned openings, and the third metal layer has a first data line, a second data line, a third source, and a fourth source;

a third insulating layer disposed on the third metal layer; and a pixel electrode disposed on the third insulating layer, wherein the pixel electrode is electrically connected with the drain;

wherein the first data line and the second data line are disposed on the first insulating layer and arranged in parallel corresponding to the patterned openings respectively in the first direction;

wherein the third source and the fourth source are disposed on the first source and the second source respectively, corresponding to the patterned openings, and distanced away from each other for a second distance D2; and wherein the first distance D1 is greater than the second distance D2, and $D1 \leq (Q*D2)$, and $Q \geq 2$.

8. The pixel structure according to claim 7, wherein the first data line is electrically connected to the first source and the third source, and the second data line is electrically connected to the second source and the fourth source.

9. The pixel structure according to claim 7, wherein the drain is disposed between the first data line and the second data line in the first direction.

10. The pixel structure according to claim 7, wherein the second insulating layer covers the drain.

11. The pixel structure according to claim 7, wherein the first source and the second source have a first line width W1, the third source and the fourth source have a second line width W2, and the second line width W2 is greater than the first line width W1.

12. The pixel structure according to claim 11, wherein the second line width W2 and the first line width W1 have a ratio R, and the ratio R satisfies $3 \geq R \geq 1.5$.

13. The pixel structure according to claim 7, wherein the first data line and the second data line extend along a second direction, the gate line extends along the first direction, and the first data line and the second data line intersect with the gate line.

* * * * *